METHOD OF PLATING QUARTZ CRYSTALS
Filed Nov. 1, 1955
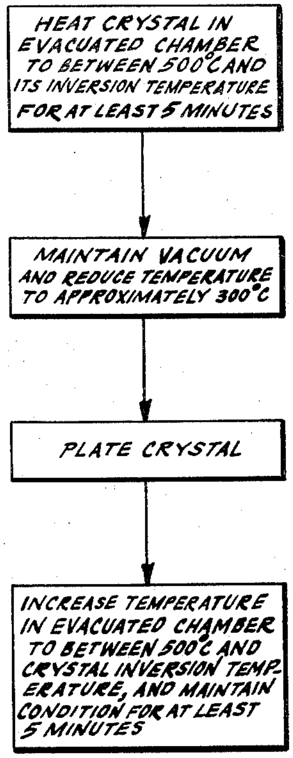
INVENTORS
PAUL D. GERBER &
WILLIAM SCHAFER, JR.
BY Charles H. Brown
ATTORNEY United States Patent Office 2,856,313

Patented Oct. 14, 1958

2,856,313

METHOD OF PLATING QUARTZ CRYSTALS

Paul Daniel Gerber, Woodlynne, and William Schafer, Jr., Camden, N. J., assignors, by mesne assignments, to the United States of America as represented by the Secretary of the Army Application November 1, 1955, Serial No. 544,345

6 Claims. (Cl. 117—65)

The invention relates to a method of plating quartz crystals, and particularly to a method of plating metallic electrodes on piezoelectric quartz crystals.

In the manufacture of piezoelectric quartz crystals requiring a metallic plating on their surfaces to serve as electrodes for the crystal, it is difficult to obtain strong adhesion between the metal plating and the crystal surface. The trend toward higher frequency stability has required that the crystals have more highly polished surfaces. And, the more highly polished crystal surfaces have made a strong adhesion between the metal plating and the crystal surface even more difficult to obtain.

Accordingly, an object of the invention is to devise an improved method of plating polished or semi-polished quartz crystals.

Another object of the invention is to provide a durable and adhesive plating for polished piezoelectric quartz crystals.

Briefly, the method of plating quartz crystals in accordance with the invention comprises the steps of heating the crystal in an evacuated chamber, plating the crystal in an evacuated chamber, and then heat treating the plated crystal in an evacuated chamber.

The single figure of the drawing shows a flow chart on which the steps of the plating method are outlined.

A suitable chamber which can be used is a conventional bell jar and base which can be evacuated and which can accommodate the necessary apparatus. The apparatus usually comprises a work holder, a mask, heating and evaporating devices, and a suitable crystal temperature indicating device. The crystal to be plated is placed in the work holder in the chamber, and the mask or stencil is placed over the crystal so that the finished plating will have the desired outline. A plating metal, such as gold, is loaded or placed on the evaporating device, which is preferably an electrical evaporating filament. The chamber is then closed or sealed, and exhausted or evacuated to a vacuum of at least .03 micron ($3\times10^{-5}$ millimeter) of mercury. The crystal is slowly heated, preferably by the use of an electrical heater filament positioned around and near the crystal, until the crystal temperature is in the range between 500° C. (centigrade) and the inversion temperature of the crystal being plated. The crystal may be heated while the chamber is being evacuated. It should be heated slowly enough to prevent damage to the crystal resulting from rapid expansion due to heating the crystal too quickly. It is important that the crystal temperature be held below the inversion temperature of the crystal so that the characteristics of the crystal are not changed. The crystal temperature is then maintained within this range and the chamber is maintained at or below this vacuum for at least five minutes in order to remove as many vapors as possible from the chamber. It is believed that the presence of vapors, particularly water vapors, on the crystal surface to be plated is a detrimental factor in preventing the deposition of a good plating. Therefore, it is desirable to maintain the crystal at the highest possible temperature below the crystal inversion temperature, and to maintain the chamber at the highest possible vacuum, both for the longest possible time in order to obtain the most durable and adhesive plating. However, where large quantities of crystals are being plated, it may be economically impractical to maintain the crystal and the chamber under the most ideal conditions for long periods of time. For this reason, the temperatures, vacuums, and times given in this description represent the conditions found to be most practical.

After the crystal has been held within this temperature range and the chamber held below this vacuum, both for at least five minutes, the crystal is then allowed to cool to approximately 300° C. The crystal surface is then plated. If the plating is done by evaporation, the evaporating device is heated to vaporize the plating metal and cause it to be projected thermally against the crystal surface. The process is continued until the plating has the desired thickness. If all the plating metal is to be evaporated during a plating process, the amount of metal needed can be determined experimentally. Or, if it is desired to load enough plating metal to plate more than one crystal surface, the rate of evaporation and the length of time such evaporation is continued can also be determined experimentally. During the process of the plating, the crystal temperature is maintained at approximately 300° C. and the chamber vacuum is maintained at or below .05 micron of mercury, but preferably below .02 micron of mercury.

After the crystal is plated, the plating is heat treated by slowly heating the crystal to a temperature between 500° C. and the crystal inversion temperature while maintaining the chamber at a vacuum of at least .03 micron of mercury. The plating is heat treated under these conditions for at least five minutes, after which the crystal is allowed to cool to at least 300° C. before the crystal is removed from the chamber. Platings deposited by evaporation have a tendency to be porous or spongy, and it is believed that heat treating the plated crystal in a high vacuum reduces the plating to near bulk resistivity. This increases the resistance of the plating to abrasion when the crystal is handled, and improves the frequency stability of the crystal from an aging point of view.

The process just described pertains to plating one surface of a crystal or to plating a plurality of surfaces simultaneously. If a crystal has two surfaces that are to be separately plated, additional steps are required. However, the process for plating two surfaces separately is the same through the step of evaporating the plating on one surface. After the first surface is plated, the crystal is then positioned for plating the second surface, and the mask is placed over the crystal. If possible, this is done while maintaining the crystal temperature at the plating temperature and while maintaining the chamber closed and at the plating vacuum. If the chamber must be opened to prepare the crystal and apparatus for the second plating, it must then be re-evacuated and the crystal must be reheated, a step which may be expensive and lengthy when large quantities of crystals are to be plated. In either case, the crystal with the plating on one surface is heated to a temperature in the range between 500° C. and the crystal inversion temperature, and the chamber is evacuated to a vacuum of at least .03 micron of mercury. The crystal is maintained within this temperature range and the chamber is maintained at or below this vacuum for at least five minutes. This step accomplishes two results, namely heat treating the first plating and preparing the second surface for plating. The crystal is then allowed to cool to approximately 300° C. and the second surface is then plated in the same manner as the first surface. During the process of the plating, the crystal temperature is maintained at approximately 300° C.

and the chamber vacuum is maintained at or below .05 micron of mercury, but preferably below .02 micron of mercury.

After the second surface is plated, the second plating is heat treated by slowly heating the crystal to a temperature between 500° C. and the crystal inversion temperature while maintaining the chamber at a vacuum of at least .03 micron of mercury. The second plating is heat treated under these conditions for at least five minutes, after which the crystal is allowed to cool to at least 300° C. before the plated crystal is removed from the chamber.

If it is desired to plate the two surfaces of a crystal simultaneously, a double mask for covering both surfaces, and apparatus for simultaneously evaporating the plating metal on both surfaces would be required. With such a mask and apparatus, the crystal could be heated in an evacuated chamber under the conditions specified, then simultaneously plated on both surfaces under the plating conditions specified, and finally heat treated under the conditions specified. Such a method would be particularly useful for plating large quantities of crystals.

This process of plating crystals provides platings which adhere well even to highly polished quartz crystal surfaces. Furthermore, these platings have an almost bulk resistivity which makes them more resistant to abrasion and which improves the frequency stability of the crystal from an aging point of view.

The invention claimed is:

1. A method of plating quartz crystals, comprising the steps of heating the crystal to be plated to a temperature in the range between 500° C. and the inversion temperature of said crystals in an evacuated chamber, plating said heated crystal in said evacuated chamber, and heat treating said plated crystal in said evacuated chamber at a temperature within said range.

2. A method of plating quartz crystals, comprising the steps of placing the crystal to be plated in a closed chamber, evacuating said chamber to a vacuum of at least .03 micron of mercury and heating said crystal while maintaining said vacuum, plating said heated crystal in said chamber in a vacuum of at least .05 micron of mercury, and heat treating said plated crystal in said chamber in a vacuum of at least .03 micron of mercury.

3. A method of plating quartz crystals in a chamber, comprising the steps of evacuating said chamber to a vacuum of at least .03 micron of mercury and heating the crystal to be plated to a temperature between 500° C. and the inversion temperature of said crystal, reducing the temperature of said crystal while maintaining said chamber at a vacuum of at least .05 micron of mercury, plating said crystal with an opaque metallic material while maintaining said crystal at said reduced temperature and while maintaining said chamber at least at said vacuum of .05 micron of mercury, and reheating said crystal to a temperature between 500° C. and said inversion temperature while maintaining said chamber at a vacuum of at least .03 micron of mercury.

4. A method of plating quartz crystals in a chamber, comprising the steps of heating the crystal to be plated to a temperature between 500° C. and the inversion temperature of said crystal and evacuating said chamber to a vacuum of at least .03 micron of mercury, reducing the temperature of said crystal to approximately 300° C. while maintaining said vacuum, plating said crystal with an opaque metallic material while maintaining said crystal at said reduced temperature and while maintaining said chamber at substantially said vacuum, and heat treating said plated crystal by reheating said crystal to a temperature between 500° C. and said inversion temperature while maintaining said chamber at least at said vacuum.

5. A method of plating electrodes on quartz crystals, comprising the steps of positioning said crystal in a chamber, evacuating said chamber to a vacuum of at least .03 micron of mercury and slowly heating said crystal to a temperature in the range between 500° C. and the inversion temperature of said crystal, maintaining said crystal within said temperature range and maintaining said chamber at least at said vacuum for at least five minutes, reducing the temperature of said crystal to approximately 300° C. while maintaining said chamber at a vacuum of at least .05 micron of mercury, plating said crystal with an opaque metallic material while maintaining said crystal at said reduced temperature and while maintaining said chamber at said vacuum of at least .05 micron of mercury, slowly reheating said plated crystal to a temperature in said range while maintaining said chamber at a vacuum of at least .03 micron of mercury, and heat treating said plated crystal by maintaining said plated crystal within said temperature range and while maintaining said chamber at said vacuum of at least .03 micron of mercury for at least five minutes.

6. A method of plating two electrodes on a quartz crystal, comprising the steps of positioning said crystal in a chamber, evacuating said chamber to a vacuum of at least .03 micron of mercury and slowly heating said crystal to a temperature in the range between 500° C. and the inversion temperature of said crystal, maintaining said crystal within said temperature range and maintaining said chamber at least at said vacuum for at least five minutes, reducing the temperature of said crystal to approximately 300° C. while maintaining said chamber at a vacuum of at least .05 micron of mercury, plating one opaque metallic electrode on said crystal while maintaining said crystal at said reduced temperature and while maintaining said chamber at said vacuum of at least .05 micron of mercury, slowly reheating said crystal to a temperature in said range while maintaining said chamber at a vacuum of at least .03 micron of mercury, maintaining said crystal within said temperature range and maintaining said chamber at said vacuum of at least .03 micron of mercury for at least five minutes, reducing the temperature of said crystal to approximately 300° C. while maintaining said chamber at a vacuum of at least .05 micron of mercury, plating a second opaque metallic electrode on said crystal while maintaining said crystal at said reduced temperature and while maintaining said chamber at said vacuum of at least .05 micron of mercury, slowly reheating said crystal to a temperature in said range while maintaining said chamber at a vacuum of at least .03 micron of mercury, and maintaining said crystal within said temperature range and maintaining said chamber at said vacuum of at least .03 micron of mercury for at least five minutes.

References Cited in the file of this patent

UNITED STATES PATENTS

| | | |
|---|---|---|
| 1,848,893 | Lavallee | Mar. 8, 1932 |
| 2,366,954 | Brooks | Jan. 9, 1945 |
| 2,398,382 | Lyon | Apr. 16, 1946 |
| 2,546,321 | Ruggles | Mar. 27, 1951 |
| 2,765,765 | Bigler et al. | Oct. 9, 1956 |